US012782468B2

(12) United States Patent
Inglis et al.

(10) Patent No.: US 12,782,468 B2
(45) Date of Patent: Nov. 3, 2026

(54) SYSTEM AND METHOD FOR REMOVING ELECTROMAGNETIC INTERFERENCE FROM LOW-FIELD MAGNETIC RESONANCE IMAGES

(71) Applicant: neuro42, Inc., San Francisco, CA (US)

(72) Inventors: Benjamin Inglis, Petaluma, CA (US); Donghui Yin, San Francisco, CA (US); Haidong Peng, San Francisco, CA (US); Ghoncheh Amouzandeh, Alameda, CA (US); Xiaowei Zou, San Francisco, CA (US)

(73) Assignee: neuro42, Inc., San Francisco, CA (US)

( * ) Notice: Subject to any disclaimer, the term of this patent is extended or adjusted under 35 U.S.C. 154(b) by 147 days.

(21) Appl. No.: 18/954,322

(22) Filed: Nov. 20, 2024

(65) Prior Publication Data

US 2025/0155524 A1 May 15, 2025

Related U.S. Application Data

(63) Continuation of application No. 18/057,207, filed on Nov. 19, 2022, now Pat. No. 12,270,867.

(51) Int. Cl.
*G01R 33/00* (2006.01)
*G01R 33/383* (2006.01)

(52) U.S. Cl.
CPC ....... *G01R 33/0029* (2013.01); *G01R 33/383* (2013.01)

(58) Field of Classification Search
CPC .......................... G01R 33/0029; G01R 33/383
See application file for complete search history.

(56) References Cited

U.S. PATENT DOCUMENTS

2016/0069970 A1 3/2016 Rearick et al.
2020/0058106 A1 2/2020 Lazarus et al.
(Continued)

FOREIGN PATENT DOCUMENTS

JP S62122646 A 6/1987
WO WO-2022236308 A1 11/2022
(Continued)

OTHER PUBLICATIONS

L. Yang, W. He, Y. He, J. Wu, S. Shen and Z. Xu, "Active EMI Suppression System for a 50 mT Unshielded Portable MRI Scanner," in IEEE Transactions on Biomedical Engineering, vol. 69, No. 11, pp. 3415-3426, Nov. 2022 (Year: 2022).*
(Continued)

*Primary Examiner* — Daniel R Miller
(74) *Attorney, Agent, or Firm* — Wilson Sonsini Goodrich & Rosati

(57) ABSTRACT

The present disclosure provides systems and methods for removing electromagnetic interference from low-field magnetic resonance images. In one aspect, a method can include projecting a low-field strength magnetic field toward an object of interest located within a field of view and transmitting a radio frequency pulse sequence to a radio frequency coil assembly configured to selectively excite magnetization in the object of interest within the field of view. The method can further include receiving an output signal from the radio frequency coil assembly during a signal acquisition period and receiving a sample signal from the radio frequency coil assembly during an interference period. The method can further include comparing the output signal and the sample signal to identify an interference component and adjusting the output signal based on the interference component.

20 Claims, 10 Drawing Sheets

(56) References Cited

U.S. PATENT DOCUMENTS

| | | | |
|---|---|---|---|
| 2023/0132819 | A1 | 5/2023 | Wald et al. |
| 2024/0168105 | A1 | 5/2024 | Inglis et al. |

FOREIGN PATENT DOCUMENTS

| | | | |
|---|---|---|---|
| WO | WO-2023244980 | A1 | 12/2023 |
| WO | WO-2024108097 | A1 | 5/2024 |

OTHER PUBLICATIONS

J. Su et al., "A CNN Based Software Gradiometer for Electromagnetic Background Noise Reduction in Low Field MRI Applications," in IEEE Transactions on Medical Imaging, vol. 41, No. 5, pp. 1007-1016, May 2022 (Year: 2022).*

Cooley, Clarissa Zimmerman. et al. Design of Sparse Halbach Magnet Arrays for Portable MRI Using a Genetic Algorithm. IEEE Transactions on Magnetics 54(1):5100112, 1-12 (2018). Published online Oct. 23, 2017.

Erturk, M Arcan. et al. Spectral subtraction de-noising of MRI. Cairo International Biomedical Engineering Conference :138-141 (2012).

IEEE Standard for Information technology—Telecommunications and information exchange between systems—Local and metropolitan area networks—Specific requirements Part 3: Carrier Sense Multiple Access with Collision Detection (CSMA/CD) Access Method and Physical Layer Specifications. IEEE Standard 802.3:1-2977 (2008).

Liu, Yilong. et al. A Low-Cost and Shielding-free Ultra-low-field Brain MRI Scanner. Nature Communications 12(1):7238, 1-14 (2021).

PCT/US2023/080237 International Search Report and Written Opinion dated Mar. 12, 2024.

The ATM Forum Technical Committee. ATM-MPLS Network Interworking Version 2.0, Aug. 2003; [retrieved on Aug. 20, 2024]. Available at URL:https://www.broadband-forum.org/download/af-aic-0178.001.pdf pp. 1-34.

* cited by examiner

SYSTEM AND METHOD FOR REMOVING ELECTROMAGNETIC INTERFERENCE FROM LOW-FIELD MAGNETIC RESONANCE IMAGES

CROSS-REFERENCE TO RELATED APPLICATION

This application is a continuation of U.S. patent application Ser. No. 18/057,207, filed Nov. 19, 2022, the full disclosure of which is incorporated herein by reference.

BACKGROUND

The present disclosure relates to magnetic resonance imaging (MRI), medical imaging, medical intervention, and surgical intervention. MRI systems often include large and complex machines that generate significantly high magnetic fields and create significant constraints on the feasibility of certain surgical interventions. Restrictions can include limited physical access to the patient by a surgeon and/or a surgical robot and/or limitations on the usage of certain electrical and mechanical components in the vicinity of the MRI scanner. Such limitations are inherent in the underlying design of many existing systems and are difficult to overcome.

SUMMARY

In one aspect, the present disclosure describes a method. The method includes projecting a low-field strength magnetic field toward an object of interest located within a field of view and transmitting a radio frequency pulse sequence to a radio frequency coil assembly configured to selectively excite magnetization in the object of interest within the field of view. The radio frequency pulse sequence can define a time of repetition and includes a signal acquisition period within each time of repetition. The method can further include receiving an output signal from the radio frequency coil assembly during the signal acquisition period and receiving a sample signal from the radio frequency coil assembly at an interference period within the time of repetition. The interference period can flank the signal acquisition period. The method can further include comparing the output signal and the sample signal to identify an interference component and adjusting the output signal based on the interference component; and recording the adjusted output signal in a k-space matrix.

In another aspect, the present disclosure describes a system. The system includes an array of magnets, a radio frequency coil assembly, and control circuit. The array of magnets can be configured to generate a low-field strength magnetic field toward an object of interest located within a field of view. The radio frequency coil assembly can be configured to selectively excite magnetization in the object of interest in the field of view. The control circuit can include a processor and a memory. The memory can store instructions executable by the processor to transmit a radio frequency pulse sequence to the radio frequency coil assembly. The radio frequency pulse sequence defines a time of repetition, wherein the radio frequency pulse sequence comprises a signal acquisition period and at least one interference period within each time of repetition, wherein each interference period flanks the signal acquisition period. The memory can further store instructions executable by the processor to receive an output signal from the radio frequency coil assembly during the signal acquisition period and receive a sample signal from the radio frequency coil assembly during the interference period within the time of repetition. The memory can further store instructions executable by the processor to compare the output signal and the sample signal to identify an interference component and adjust the output signal based on the interference component and record the adjusted output signal in a k-space matrix.

BRIEF DESCRIPTION OF THE DRAWINGS

The various aspects described herein, both as to organization and methods of operation, together with further objects and advantages thereof, may best be understood by reference to the following description, taken in conjunction with the accompanying drawings as follows.

Corresponding reference characters indicate corresponding parts throughout the several views. The exemplifications set out herein illustrate various disclosed embodiments, is one form, and such exemplifications are not to be construed as limiting the scope thereof in any manner.

DETAILED DESCRIPTION

Applicant of the present application also owns the following patent applications, which are each herein incorporated by reference in their respective entireties: International Patent Application No. PCT/US2022/72143, titled NEURAL INTERVENTIONAL MAGNETIC RESONANCE IMAGING APPARATUS, filed May 5, 2022.

Before explaining various aspects of neural interventional magnetic resonance imaging devices in detail, it should be noted that the illustrative examples are not limited in application or use to the details of construction and arrangement of parts illustrated in the accompanying drawings and description. The illustrative examples may be implemented or incorporated in other aspects, variations and modifications, and may be practiced or carried out in various ways. Further, unless otherwise indicated, the terms and expressions employed herein have been chosen for the purpose of describing the illustrative examples for the convenience of the reader and are not for the purpose of limitation thereof. Also, it will be appreciated that one or more of the following-described aspects, expressions of aspects, and/or examples, can be combined with any one or more of the other following-described aspects, expressions of aspects and/or examples.

Various aspects are directed to neural interventional magnetic resonance imaging (MRI) devices that allows for the integration of surgical intervention and guidance with an MRI. This includes granting physical access to the area around the patient as well as access to the patient's head with one or more access apertures. In addition, the neural interventional MRI device may allow for the usage of robotic guidance tools and/or traditional surgical implements. In various instances, a neural interventional MRI can be used intraoperatively to obtain scans of a patient's head and/or brain during a surgical intervention, such as a surgical procedure like a biopsy or neural surgery.

Figure 1:
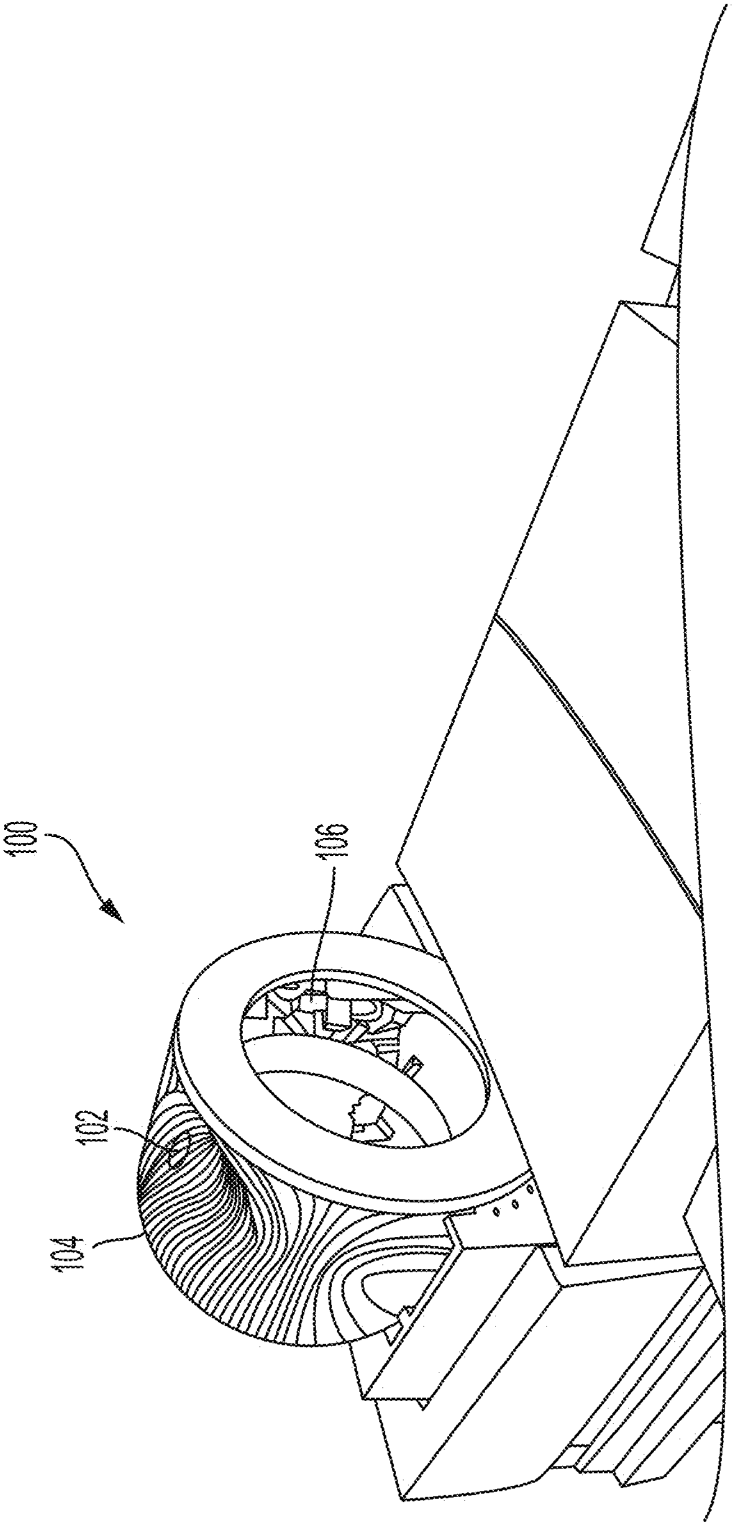
FIG. 1 depicts components of a MRI scanning system including a dome-shaped housing for a magnetic array, the dome-shaped housing surrounding a region of interest therein and further depicting the dome-shaped housing positioned to receive at least a portion of the head of a patient reclined on the table into the region of interest, in accordance with at least one aspect of the present disclosure.

FIG. 1 depicts a MRI scanning system 100 that includes a dome-shaped housing 102 configured to receive a patient's head. The dome-shaped housing 102 can further include at least one access aperture configured to allow access to the patient's head to enable a neural intervention. A space within the dome-shaped housing 102 forms the region of interest for the MRI scanning system 100. Target tissue in the region of interest is subjected to magnetization fields/pulses, as further described herein, to obtain imaging data representative of the target tissue.

Figure 1A:
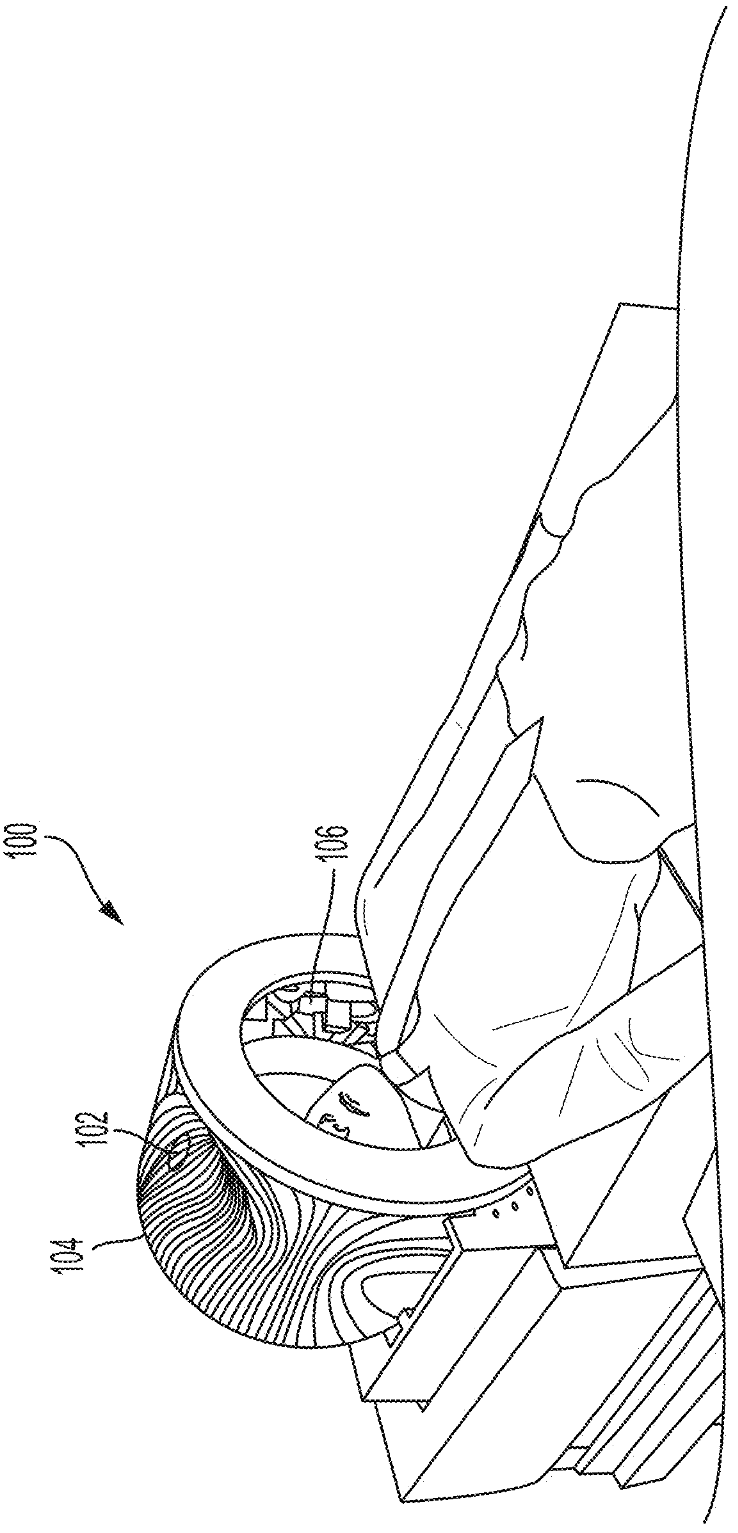
FIG. 1A depicts a patient's head positioned in the region of interest of the MRI scanning system of FIG. 1.

For example, referring to FIG. 1A, a patient can be positioned such that his/her head is positioned within the region of interest within the dome-shaped housing 102. The brain can be positioned entirely within the dome-shaped housing 102. In such instances, to facilitate intracranial interventions (e.g. neurosurgery) in concert with MR imaging, the dome-shaped housing 102 can include one or more apertures that provide access to the brain. Apertures can be spaced apart around the perimeter of the dome-shaped housing.

The MRI scanning system 100 can include an auxiliary cart (see, e.g. auxiliary cart 540 in FIG. 6) that houses certain conventional MRI electrical and electronic components, such as a computer, programmable logic controller, power distribution unit, and amplifiers, for example. The MRI scanning system 100 can also include a magnet cart that holds the dome-shaped housing 102, gradient coil(s), and/or a transmission coil, as further described herein. Additionally, the magnet cart can be attached to a receive coil in various instances. Referring primarily to FIG. 1, the dome-shaped housing 102 can further include RF transmission coils, gradient coils 104 (depicted on the exterior thereof), and shim magnets 106 (depicted on the interior thereof). Alternative configurations for the gradient coil(s) 104 and/or shim magnets 106 are also contemplated. In various instances, the shim magnets 106 can be adjustably positioned in a shim tray within the dome-shaped housing 102, which can allow a technician to granularly configure the magnetic flux density of the dome-shaped housing 102.

Various structural housings for receiving the patient's head and enabling neural interventions can be utilized with a MRI scanning system, such as the MRI scanning system 100. In one aspect, the MRI scanning system 100 may be outfitted with an alternative housing, such as a dome-shaped housing 202 (FIG. 2) or a two-part housing 302 (FIG. 3) configured to form a dome-shape. The dome-shaped housing 202 defines a plurality of access apertures 203; the two-part housing 302 also defines a plurality of access apertures 303 and further includes an adjustable gap 305 between the two parts of the housing.

Figure 3:
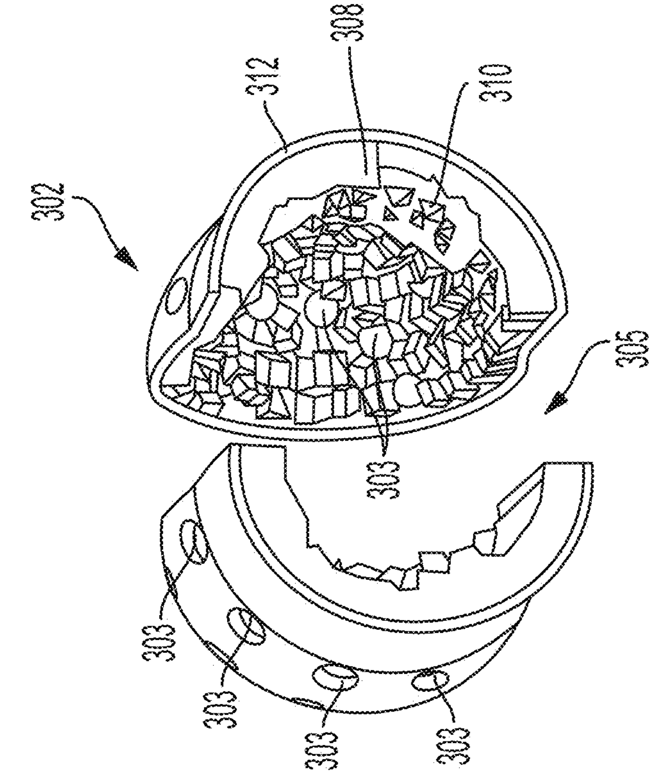
FIG. 3 is a perspective view of an alternative dome-shaped housing for a magnetic array for use with the MRI scanning system of FIG. 1, wherein access apertures and an adjustable gap is defined in the dome-shaped housing, in accordance with at least one aspect of the present disclosure.

In various instances, the housings 202 and 302 can include a bonding agent 308, such as an epoxy resin, for example, that holds a plurality of magnetic elements 310 in fixed positions. The plurality of magnetic elements 310 can be bonded to a structural housing 312, such as a plastic substrate, for example. In various aspects, the bonding agent 308 and structural housing 312 may be non-conductive or diamagnetic materials. Referring primarily to FIG. 3, the two-part housing 302 comprises two structural housings 312. In various aspect, a structural housing for receiving the patient's head can be formed from more than two sub-parts. The access apertures 303 in the structural housing 312 provide a passage directly to the patient's head and are not obstructed by the structural housing 312, bonding agent 308, or magnetic elements 310. The access apertures 303 can be positioned in an open space of the housing 302, for example.

There are many possible configurations of neural interventional MRI devices that can achieve improved access for surgical intervention. Many configurations build upon two main designs, commonly known as the Halbach cylinder and the Halbach dome described in the following article: Cooley et al. (e.g. Cooley, C. Z., Haskell, M. W., Cauley, S. F., Sappo, C., Lapierre, C. D., Ha, C. G., Stockmann, J. P., & Wald, L. L. (2018). Design of sparse Halbach magnet arrays for portable MRI using a genetic algorithm. *IEEE transactions on magnetics,* 54(1), 5100112. The article "Design of sparse Halbach magnet arrays for portable MRI using a genetic algorithm" by Cooley et al., published in *IEEE transactions on magnetics,* 54(1), 5100112 in 2018, is incorporated by reference herein in its entirety.

In various instances, a dome-shaped housing for an MRI scanning system, such as the system 100, for example, can include a Halbach dome defining a dome shape and configured based on several factors including main magnetic field $B_0$ strength, field size, field homogeneity, device size, device weight, and access to the patient for neural intervention. In various aspects, the Halbach dome comprises an exterior radius and interior radius at the base of the dome. The Halbach dome may comprise an elongated cylindrical portion that extends from the base of the dome. In one aspect, the elongated cylindrical portion comprises the same exterior radius and interior radius as the base of the dome and continues from the base of the dome at a predetermined length, at a constant radius. In another aspect, the elongated cylindrical portion comprises a different exterior radius and interior radius than the base of the dome (see e.g. FIGS. 2 and 3). In such instances, the different exterior radius and interior radius of the elongated cylindrical portion can merge with the base radii in a transitional region.

Figure 2:
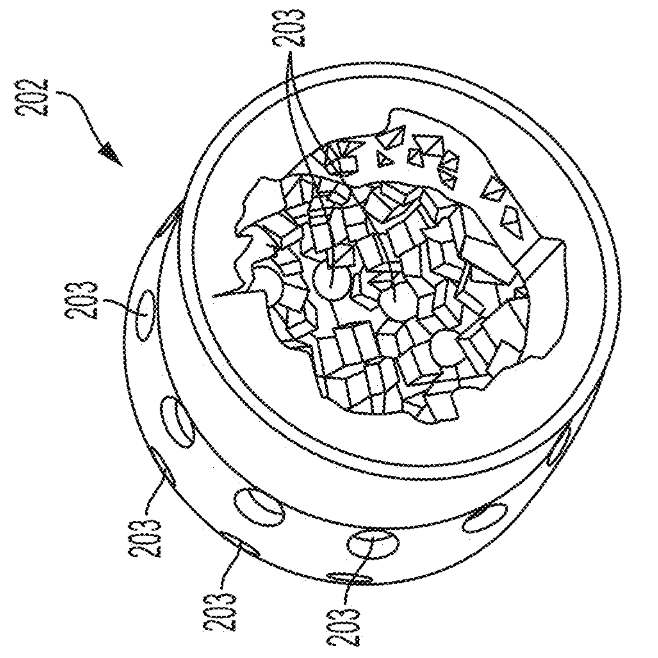
FIG. 2 is a perspective view of an alternative dome-shaped housing for a magnetic array for use with the MRI scanning system of FIG. 1, wherein access apertures are defined in the dome-shaped housing, in accordance with at least one aspect of the present disclosure.
Figure 4:
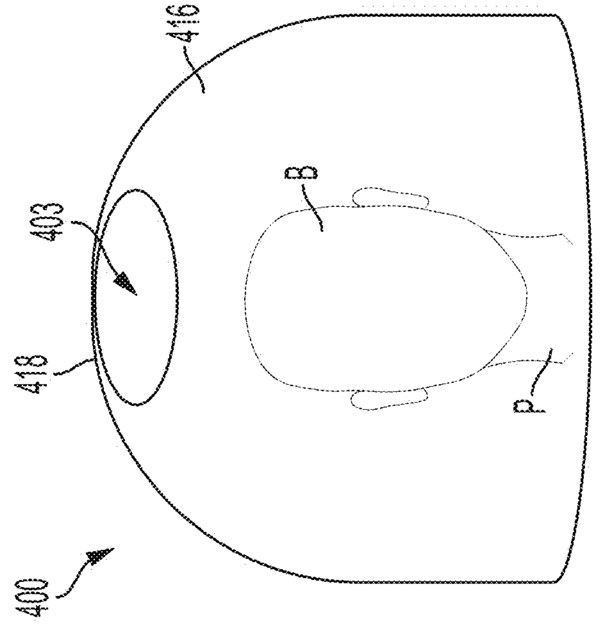
FIG. 4 depicts a dome-shaped housing for use with a MRI scanning system having an access aperture in the form of a centrally-defined hole, in accordance with at least one aspect of the present disclosure.

FIG. 4 illustrates an exemplary Halbach dome 400 for an MRI scanning system, such as the system 100, for example, which defines an access aperture in the form of a hole or access aperture 403, where the dome 400 is configured to receive a head and brain B of the patient P within the region of interest therein, and the access aperture 403 is configured to allow access to the patient P to enable neural intervention with a medical instrument and/or robotically-controlled surgical tool, in accordance with at least one aspect of the present disclosure. The Halbach dome 400 can be built with a single access aperture 403 at the top side 418 of the dome 400, which allows for access to the top of the skull while minimizing the impact to the magnetic field. Additionally or alternatively, the dome 300 can be configured with multiple access apertures around the structure 416 of the dome 400, as shown in FIGS. 2 and 3.

The diameter $D_{hole}$ of the access aperture 403 may be small (e.g. about 2.54 cm) or very large (substantially the exterior $r_{ext}$ diameter of the dome 400). As the access aperture 403 becomes larger, the dome 400 begins to resemble a Halbach cylinder, for example. The access aperture 403 is not limited to being at the apex of the dome 400. The access aperture 403 can be placed anywhere on the surface or structure 416 of the dome 400. In various instances, the entire dome 400 can be rotated so that the access aperture 403 can be co-located with a desired physical location on the patient P.

Figure 5:
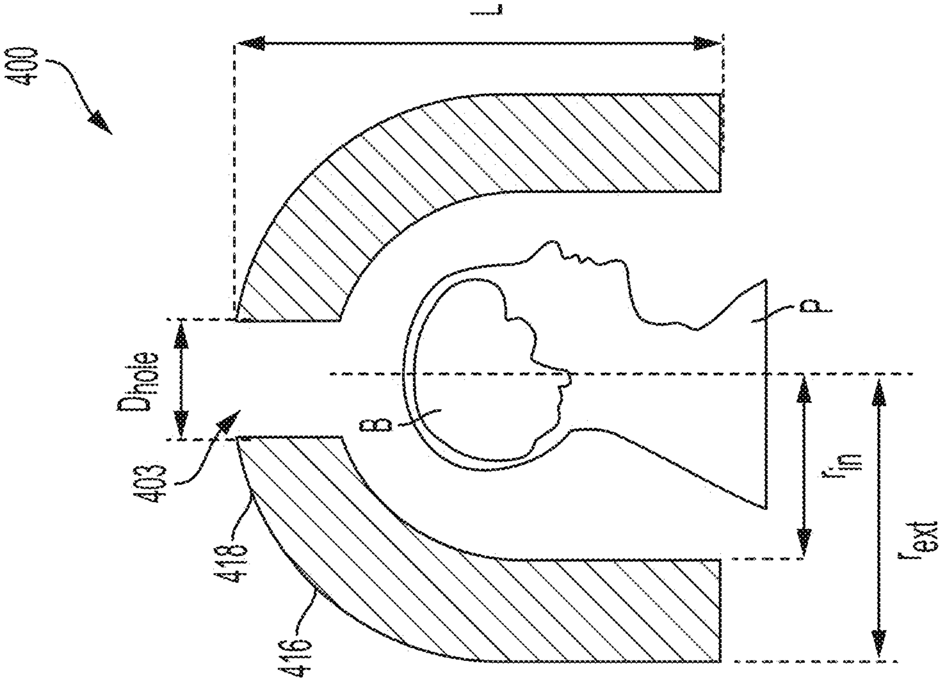
FIG. 5 is a cross-sectional view of the dome-shaped housing of FIG. 4, in accordance with at least one aspect of the present disclosure.

FIG. 5 depicts relative dimensions of the Halbach dome 400, including a diameter $D_{hole}$ of the access aperture 403, a length L of the dome 400, and an exterior radius $r_{ext}$ and an interior radius $r_{in}$ of the dome 400. The Halbach dome 400 comprises a plurality of magnetic elements that are configured in a Halbach array and make up a magnetic assembly. The plurality of magnetic elements may be enclosed by the exterior radius $r_{ext}$ and interior radius $r_{in}$ in the structure 416 or housing thereof. In one aspect, example dimensions may be defined as: $r_{in}$=19.3 cm; $r_{ext}$=23.6 cm; L=38.7 cm; and 2.54 cm≤D<19.3 cm.

Based on the above example dimensions, a Halbach dome 400 with an access aperture 403 may be configured with a magnetic flux density $B_0$ of around 72 mT, and an overall mass of around 35 kg. It will be appreciated that the dimensions may be selected based on particular applications to achieve a desired magnetic flux density $B_0$, total weight of the Halbach dome 400 and/or magnet cart, and geometry of the neural intervention access aperture 403.

In various aspects, the Halbach dome 400 may be configured to define multiple access apertures 403 placed around the structure 416 of the dome 400. These multiple access apertures 403 may be configured to allow for access to the patient's head and brain B using tools (e.g., surgical tools) and/or a surgical robot.

In various aspects, the access aperture 403 may be adjustable. The adjustable configuration may provide the ability for the access aperture 403 to be adjusted using either a motor, mechanical assist, or a hand powered system with a mechanical iris configuration, for example, to adjust the diameter $D_{hole}$ of the access aperture 403. This would allow for configuration of the dome without an access aperture 403, conducting an imaging scan, and then adjusting the configuration of the dome 400 and mechanical iris thereof to include the access aperture 403 and, thus, to enable a surgical intervention therethrough.

Halbach domes and magnetic arrays thereof for facilitating neural interventions are further described in International Patent Application No. PCT/US2022/72143, titled NEURAL INTERVENTIONAL MAGNETIC RESONANCE IMAGING APPARATUS, filed May 5, 2022, which is incorporated by reference herein in its entirety.

Figure 6:
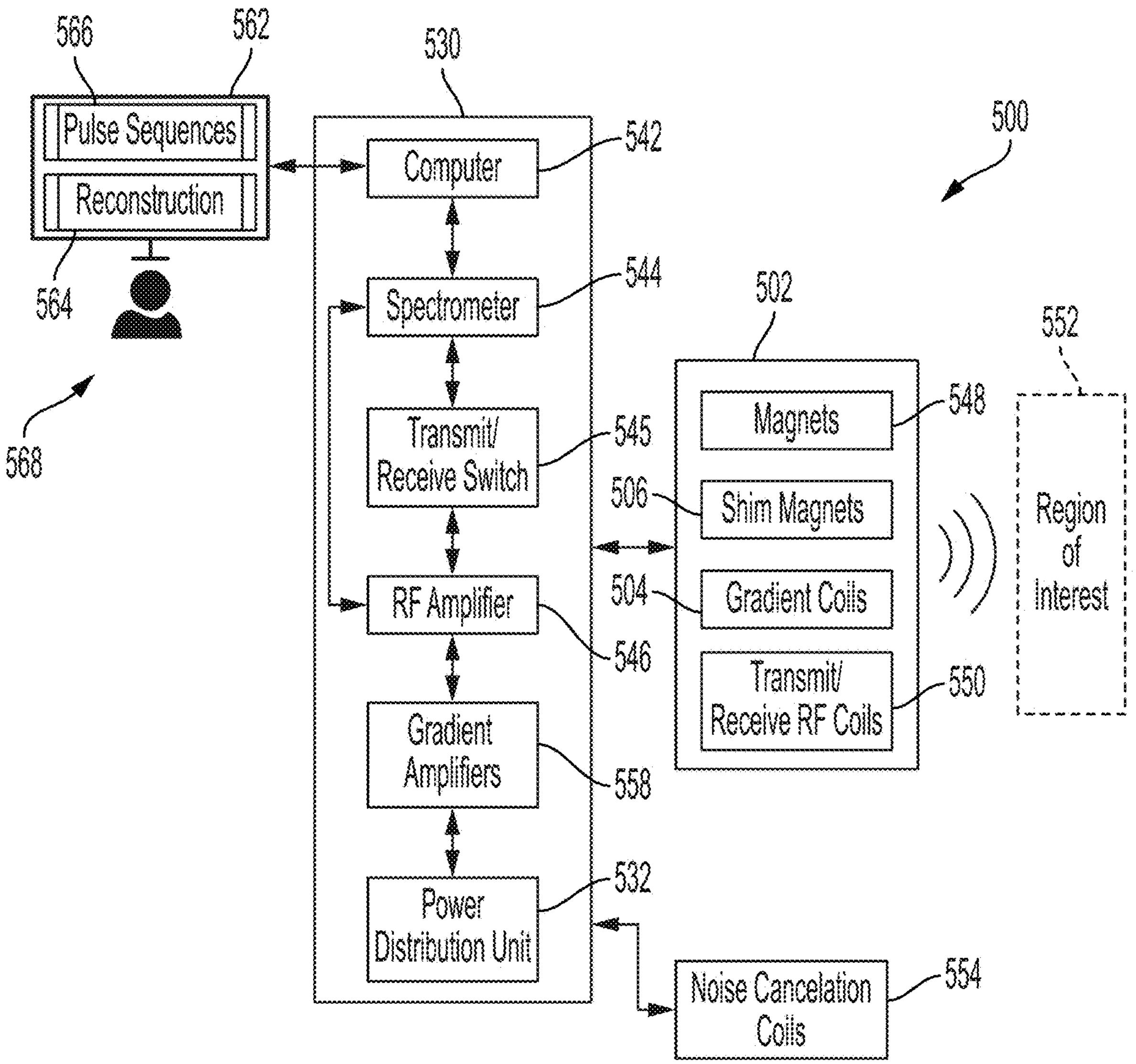
FIG. 6 depicts a control schematic for a MRI system, in accordance with at least one aspect of the present disclosure.

Referring now to FIG. 6, a schematic for an MRI system 500 is shown. The MRI scanning system 100 (FIG. 1) and the various dome-shaped housings and magnetic arrays therefor, which are further described herein, for example, can be incorporated into the MRI system 500, for example. The MRI system 500 includes a housing 502, which can be similar in many aspects to the dome-shaped housings 102 (FIG. 1), 202 (FIG. 2), and/or 302 (FIG. 3), for example. The housing 502 is dome-shaped and configured to form a region of interest, or field of view, 552 therein. For example, the housing 502 can be configured to receive a patient's head in various aspects of the present disclosure.

The housing 502 includes a magnet assembly 548 having a plurality of magnets arranged therein (e.g. a Halbach array of magnets). In various aspect, the main magnetic field $B_0$, generated by the magnetic assembly 548, extends into the field of view 552, which contains an object (e.g. the head of a patient) that is being imaged by the MRI system 500.

The MRI system 500 also includes RF transmit/receive coils 550. The RF transmit/receive coils 550 are combined into integrated transmission-reception (Tx/Rx) coils. In other instances, the RF transmission coil can be separate from the RF reception coil. For example, the RF transmission coil(s) can be incorporated into the housing 502 and the RF reception coil(s) can be positioned within the housing 502 to obtain imaging data.

The housing 502 also includes one or more gradient coils 504, which are configured to generate gradient fields to facilitate imaging of the object in the field of view 552 generated by the magnet assembly 548, e.g., enclosed by the dome-shaped housing and dome-shaped array of magnetic elements therein. Shim trays adapted to receive shim magnets 506 can also be incorporated into the housing 502.

During the imaging process, the main magnetic field $B_0$ extends into the field of view 552. The direction of the effective magnetic field ($B_1$) changes in response to the RF pulses and associated electromagnetic fields transmitted by the RF transmit/receive coils 550. For example, the RF transmit/receive coils 550 may be configured to selectively transmit RF signals or pulses to an object in the field of view 552, e.g. tissue of a patient's brain. These RF pulses may alter the effective magnetic field experienced by the spins in the sample tissue.

The housing 502 is in signal communication with an auxiliary cart 530, which is configured to provide power to the housing 502 and send/receive control signals to/from the housing 502. The auxiliary cart 530 includes a power distribution unit 532, a computer 542, a spectrometer 544, a transmit/receive switch 545, an RF amplifier 546, and gradient amplifiers 558. In various instances, the housing 502 can be in signal communication with multiple auxiliary carts and each cart can support one or more of the power distribution unit 532, the computer 542, the spectrometer 544, the transmit/receive switch 545, the RF amplifier 546, and/or the gradient amplifiers 558.

The computer 542 is in signal communication with a spectrometer 544 and is configured to send and receive signals between the computer 542 and the spectrometer 544. When the object in the field of view 552 is excited with RF pulses from the RF transmit/receive coils 550, the precession of the object results in an induced electric current, or MR current, which is detected by the RF transmit/receive coils 550 and sent to the RF preamplifier 556. The RF preamplifier 556 is configured to boost or amplify the excitation data signals and send them to the spectrometer 544. The spectrometer 544 is configured to send the excitation data to the computer 542 for storage, analysis, and image construction. The computer 542 is configured to combine multiple stored excitation data signals to create an image, for example. In various instances, the computer 542 is in signal communication with at least one database 562 that stores reconstruction algorithms 564 and/or pulse sequences 566. The computer 542 is configured to utilize the reconstruction algorithms to generate an MR image 568.

From the spectrometer 544, signals can also be relayed to the RF transmit/receive coils 550 in the housing 502 via an RF power amplifier 546 and the transmit/receive switch 545 positioned between the spectrometer 544 and the RF power amplifier 546. From the spectrometer 544, signals can also be relayed to the gradient coils 560 in the housing 502 via a gradient power amplifier 558. For example, the RF power amplifier 546 is configured to amplify the signal and send it to RF transmission coils 560, and the gradient power amplifier 558 is configured to amplify the gradient coil signal and send it to the gradient coils 560.

In various instances, the MRI system 500 can include noise cancellation coils 554. For example, the auxiliary cart 530 and/or computer 542 can be in signal communication with noise cancellation coils 554. In other instances, the noise cancellation coils 554 can be optional. For example, certain MRI systems disclosed herein may not include supplemental/auxiliary RF coils for detecting and canceling electromagnetic interference, i.e. noise.

Figure 7:
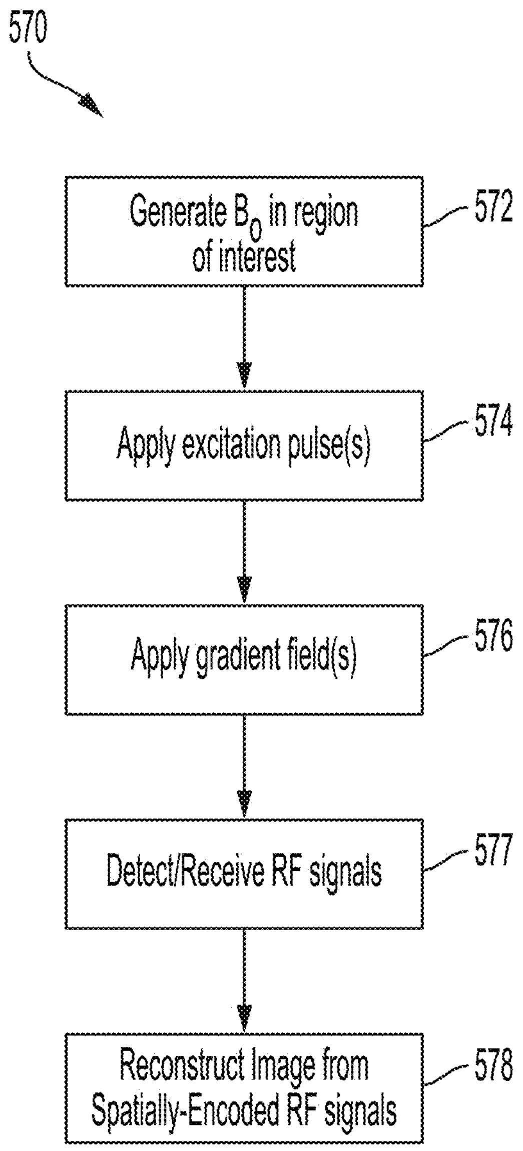
FIG. 7 is a flowchart describing a method for obtaining imaging data from an MRI system, in accordance with at least one aspect of the present disclosure.

A flowchart depicting a process 570 for obtaining an MRI image is shown in FIG. 7. The flowchart can be implemented by the MRI system 500, for example. In various instances, at block 572, the target subject (e.g. a portion of a patient's anatomy), is positioned in a main magnetic field $B_0$ in an interest of region (e.g. region of interest 552), such as within the dome-shaped housing of the various MRI scanners further described herein (e.g. magnet assembly 548). The main magnetic field $B_0$ is configured to magnetically polarize the hydrogen protons (1H-protons) of the target subject (e.g. all organs and tissues) and is known as the net longitudinal magnetization Mo. It is proportional to the proton density (PD) of the tissue and develops exponentially in time with a time constant known as the longitudinal relaxation time T1 of the tissue. T1 values of individual tissues depend on a number of factors including their microscopic structure, on the water and/or lipid content, and the strength of the polarizing magnetic field, for example. For these reasons, the T1 value of a given tissue sample is dependent on age and state of health.

At block 574, a time varying oscillatory magnetic field $B_1$, i.e. an excitation pulse, is applied to the magnetically polarized target subject with a RF coil (e.g. RF transmit/receive coil 550). The carrier frequency of the pulsed $B_1$ field is set to the resonance frequency of the 1H-proton, which causes the longitudinal magnetization to flip away from its equilibrium longitudinal direction resulting in a rotated magnetization vector, which in general can have transverse as well as longitudinal magnetization components, depending on the flip angle used. Common $B_1$ pulses include an inversion pulse, or a 180-degree pulse, and a 90-degree pulse. A 180-degree pulse reverses the direction of the 1H-proton's magnetization in the longitudinal axis. A 90-degree pulse rotates the 1H-proton's magnetization by 90 degrees so that the magnetization is in the transverse plane. The MR signals are proportional to the transverse components of the magnetization and are time varying electrical currents that are detected with suitable RF coils. These MR signals decay exponentially in time with a time constant known as the transverse relaxation time T2, which is also dependent on the microscopic tissue structure, water/lipid content, and the strength of the magnetic field used, for example.

At block 576, the MR signals are spatially encoded by exposing the target subject to additional magnetic fields generated by gradient coils (e.g. gradient coils 560), which are known as the gradient fields. The gradient fields, which vary linearly in space, are applied for short periods of time in pulsed form and with spatial variations in each direction. The net result is the generation of a plurality of spatially encoded MR signals, which are detected at block 577, and which can be reconstructed to form MR images depicting slices of the examination subject. A RF reception coil (e.g. RF transmit/receive coil 550) can be configured to detect the spatially-encoded RF signals. Slices may be oriented in the transverse, sagittal, coronal, or any oblique plane.

At block 578, the spatially encoded signals of each slice of the scanned region are digitized and spatially decoded mathematically with a computer reconstruction program (e.g. by computer 542) in order to generate images depicting the internal anatomy of the examination subject. In various instances, the reconstruction program can utilize an (inverse) Fourier transform to back-transforms the spatially-encoded data (k-space data) into geometrically decoded data.

Figure 8:
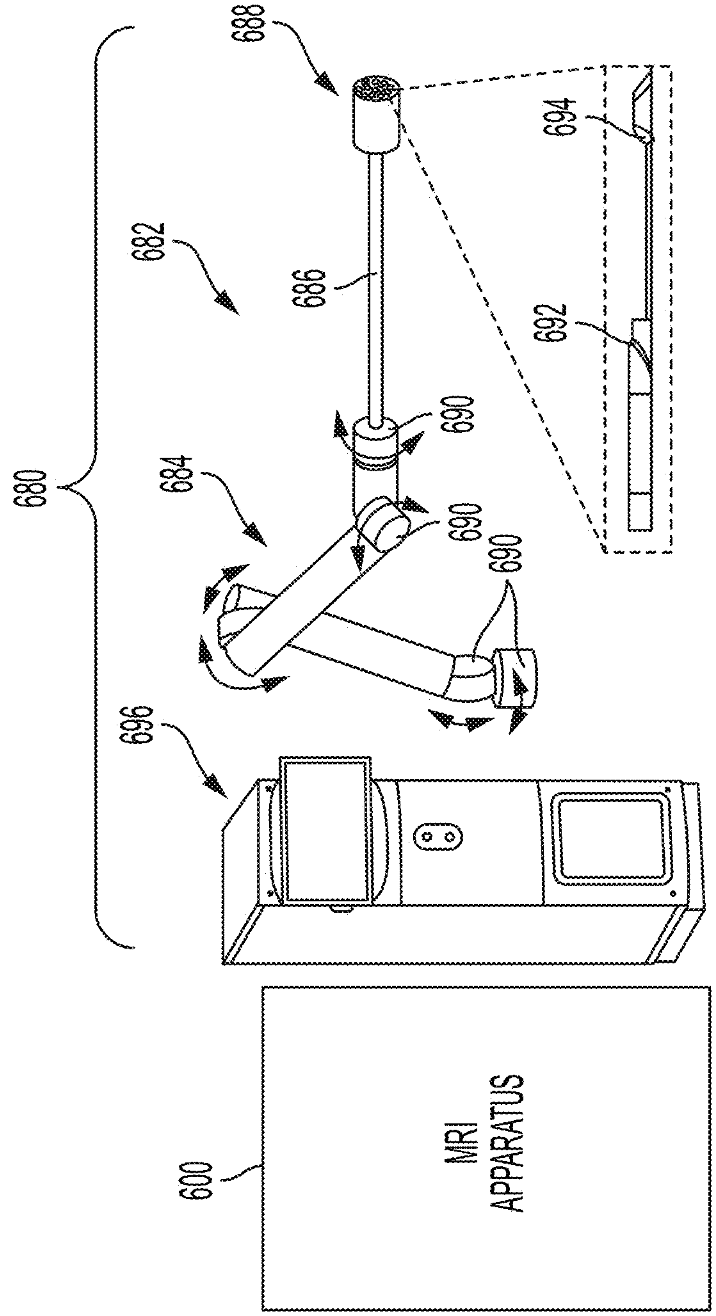
FIG. 8 depicts a MRI scanning system and a robotic system, in accordance with at least one aspect of the present disclosure.

FIG. 8 depicts a graphical illustration of a robotic system 680 that may be used for neural intervention with an MRI scanning system 600. The robotic system 680 includes a computer system 696 and a surgical robot 682. The MRI scanning system 600 can be similar to the MRI system 500 and can include the dome-shaped housing and magnetic arrays having access apertures, as further described herein. For example, the MRI system 500 can include one or more access apertures defined in a Halbach array of magnets in the permanent magnet assembly to provide access to one or more anatomical parts of a patient being imaged during a medical procedure. In various instances, a robotic arm and/or tool of the surgical robot 682 is configured to extend through an access aperture in the permanent magnet assembly to reach a patient or target site. Each access aperture can provide access to the patient and/or surgical site. For example, in instances of multiple access apertures, the multiple access apertures can allow access from different directions and/or proximal locations.

In accordance with various embodiments, the robotic system 680 is configured to be placed outside the MRI system 600. As shown in FIG. 8, the robotic system 680 can include a robotic arm 684 that is configured for movements with one or more degrees of freedom. In accordance with various embodiments, the robotic arm 684 includes one or more mechanical arm portions, including a hollow shaft 686 and an end effector 688. The hollow shaft 686 and end effector 688 are configured to be moved, rotated, and/or swiveled through various ranges of motion via one or more motion controllers 690. The double-headed curved arrows in FIG. 8 signify exemplary rotational motions produced by the motion controllers 690 at the various joints in the robotic arm 684.

In accordance with various embodiments, the robotic arm 684 of the robotic system 682 is configured for accessing various anatomical parts of interest through or around the MRI scanning system 600. In accordance with various embodiments, the access aperture is designed to account for the size of the robotic arm 684. For example, the access aperture defines a circumference that is configured to accommodate the robotic arm 684, the hollow shaft 686, and the end effector 688 therethrough. In various instances, the robotic arm 684 is configured for accessing various anatomical parts of the patient from around a side of the magnetic imaging apparatus 600. The hollow shaft 686 and/or end effector 688 can be adapted to receive a robotic tool 692, such as a biopsy needle having a cutting edge 694 for collecting a biopsy sample from a patient, for example.

The reader will appreciate that the robotic system 682 can be used in combination with various dome-shaped and/or cylindrical magnetic housings further described herein. Moreover, the robotic system 682 and robotic tool 692 in FIG. 8 are exemplary. Alternative robotic systems can be utilized in connection with the various MRI systems disclosed herein. Moreover, handheld surgical instruments and/or additional imaging devices (e.g. an endoscope) and/or systems can also be utilized in connection with the various MRI systems disclosed herein.

In various aspects of the present disclosure, the MRI systems described herein can comprise low field MRI (LF-MRI) systems. In such instances, the main magnetic field $B_0$ generated by the permanent magnet assembly can be between 0.1 T and 1.0 T, for example. In other instances, the MRI systems described herein can comprise ultra-low field MRI (ULF-MRI) systems. In such instances, the main magnetic field $B_0$ generated by the permanent magnet assembly can be between 0.03 T and 0.1 T, for example.

Higher magnetic fields, such as magnetic fields above 1.0 T, for example, can preclude the use of certain electrical and mechanical components in the vicinity of the MRI scanner. For example, the existence of surgical instruments and/or surgical robot components comprising metal, specially ferrous metals, can be dangerous in the vicinity of higher magnetic fields because such tools can be drawn toward the source of magnetization. Moreover, higher magnetic fields often require specifically-designed rooms with additional precautions and shielding to limit magnetic interference. Despite the limitations on high field MRI systems, low field and ultra-low field MRI systems present various challenges to the acquisition of high quality images with sufficient resolution for achieving the desired imaging objectives.

LF- and ULF-MRI systems generally define an overall magnetic field homogeneity that is relatively poor in comparison to higher field MRI systems. For example, a dome-shaped housing for an array of magnets, as further described herein, can comprise a Halbach array of permanent magnets, which generate a magnetic field $B_0$ having a homogeneity between 1,000 ppm and 10,000 ppm in the region of interest in various aspects of the present disclosure.

In certain instances, MRI systems can include a Faraday shield configured to reject environmental and system sources of electromagnetic interference (EMI). For example, for MRI systems operating at and/or above 0.5 T, the examination room holding the MRI system can be screened with a Faraday shield. Various components in the examination room must be filtered to avoid violating the shield's integrity. For example, the electrical cables in the room for supplying power to the gradient coils may require filters. In various instances, Faraday shielding may also be appropriate for certain LF-MRI systems, such as MRI systems that operate at and/or below 1.0 T and/or ULF-MRI systems, such as MRI systems that operate at and/or below 0.1 T.

Faraday shields reject EMI in the radiofrequency range by as much as 100 dB, yielding MR images with signal-to-noise ratios (SNR) that are limited either by subject body noise (at high fields) or by Johnson noise in the electronics (at low fields), both of which are Gaussian. However, such shields may not be applicable with MRI systems designed for use in a neurosurgical suite or operating room (OR). In such instances, a LF-MRI system may be used and the system may be completely unshielded or have only partial shielding from sources of EMI. Without further mitigation of the EMI, EMI sources can produce artifacts and patterns in the MR images, such as intense stripes, for example.

In certain instances, minimally-shielded and/or unshielded LF-MRI systems can incorporate one or more auxiliary EMI detection coils in concert with the primary imaging RF coil(s). While the addition of a supplemental EMI detection coil may be effective in certain instances, the additional coils increase the complexity of the MRI system and require additional space for the coils and their cables, which may interfere with other systems in the OR, such as life support systems, anesthesia equipment, surgical robots, and imaging/visualization systems like exoscopes and other neuro-navigation tools that require a clear line of sight to the surgical portal, for example.

Instead of relying on auxiliary EMI detection coils, in various aspects of the present disclosure, a MRI system can implement a method for removing EMI from LF-MRI images by sampling additional MR signals within a time of repetition (TR) for a MRI pulse sequence and using the additional sample signal(s) to determine the EMI, which can be subtracted or otherwise removed from the imaging data before the MR image is generated.

In various instances, the EMI detection and removal can be applied on channel-by-channel basis. For example, each RF receiver channel can be sampled to collect reference data for that channel. EMI can be detected and removed from a single channel transmit-and-receive RF coil in certain instances, and, in other instances, from a multi-channel RF receiver, such as a phased array coil, for example.

LF-MRI systems generally define an overall magnetic field homogeneity that is relatively poor in comparison to higher field MRI systems. An increased magnetic field inhomogeneity in the region of interest further corresponds to a shorter MR signal. For example, a dome-shaped housing for an array of magnets, as further described herein, can comprise a Halbach array of permanent magnets, which generate a magnetic field $B_0$ having a homogeneity between 1,000 ppm and 10,000 ppm in the region of interest in various aspects of the present disclosure. For example, a magnet housing that corresponds to a homogeneity at the lower end of the range, i.e. having a homogeneity of 1,000 ppm in the region of interest, and configured to generate a magnetic field of about 80 mT, corresponds to an MR signal linewidth of about 3.5 kHz and a signal time (T2*) of less than 0.3 ms. In such instances, a MR signal would only be detectable for approximately five times the T2*, which corresponds to about 1.5 ms and, in the case of a spin echo, the echo envelope would last for twice this detection time, which corresponds to about 3.0 ms. The foregoing time calculations are based on a homogeneity of 1,000 ppm; however, LF-MRI systems having an increased inhomogeneity, e.g. worse than 1,000 ppm, would produce correspondingly shorter lifetimes. In various instances, the shorter lifespan of the MR signals arising from a relatively heterogeneous LF-MRI systems and array of permanent magnets therefor can provide an opportunity for acquiring additional sample signals before and/or after the desired MR acquisition signal.

For example, in one aspect of the present disclosure, EMI, or signal noise, can be removed from imaging data obtained with a LF-MRI system configured to project a low-field strength magnetic field toward an object of interest (e.g. a patient's brain) located within a field of view. In various instances, a RF pulse sequence can be transmitted to a RF coil assembly configured to selectively excite magnetization in the object of interest within the field of view; the RF pulse sequence can define a time of repetition (TR) and comprise a signal acquisition period within each TR. Moreover, an output signal can be obtained from the RF coil assembly during the signal acquisition period and at least one sample signal can be obtained from the RF coil assembly during an interference period also within the TR. In various instances, the interference period can be temporally adjacent to the signal acquisition period and/or a pair of interference periods can flank either side of the signal acquisition period. The method can further comprise comparing the output signal and the sample signal to identify an interference component, adjusting the output signal based on the interference component, and recording the adjusted output signal in a k-space matrix. The k-space matrix can be used to generate an MR image without (or substantially without) artifacts results from the EMI.

In various instances, mitigation of EMI is essential for successful operation of LF-MRI systems in an unshielded or only partially-shielded environments. Moreover, the foregoing system and method can eliminate or reduce the need for extensive Faraday shielding or auxiliary coils and sensors for detecting the EMI in the system and/or environment. Instead, the properties of the LF-MRI signals and EM interference are exploited in a temporal method using standard RF reception coil(s) and/or coil arrays to collect data for EM interference mitigation during periods when the RF reception coil(s) and/or coil arrays are not typically collecting RF signals and/or when a coherent MR signal is not present.

Figure 9:
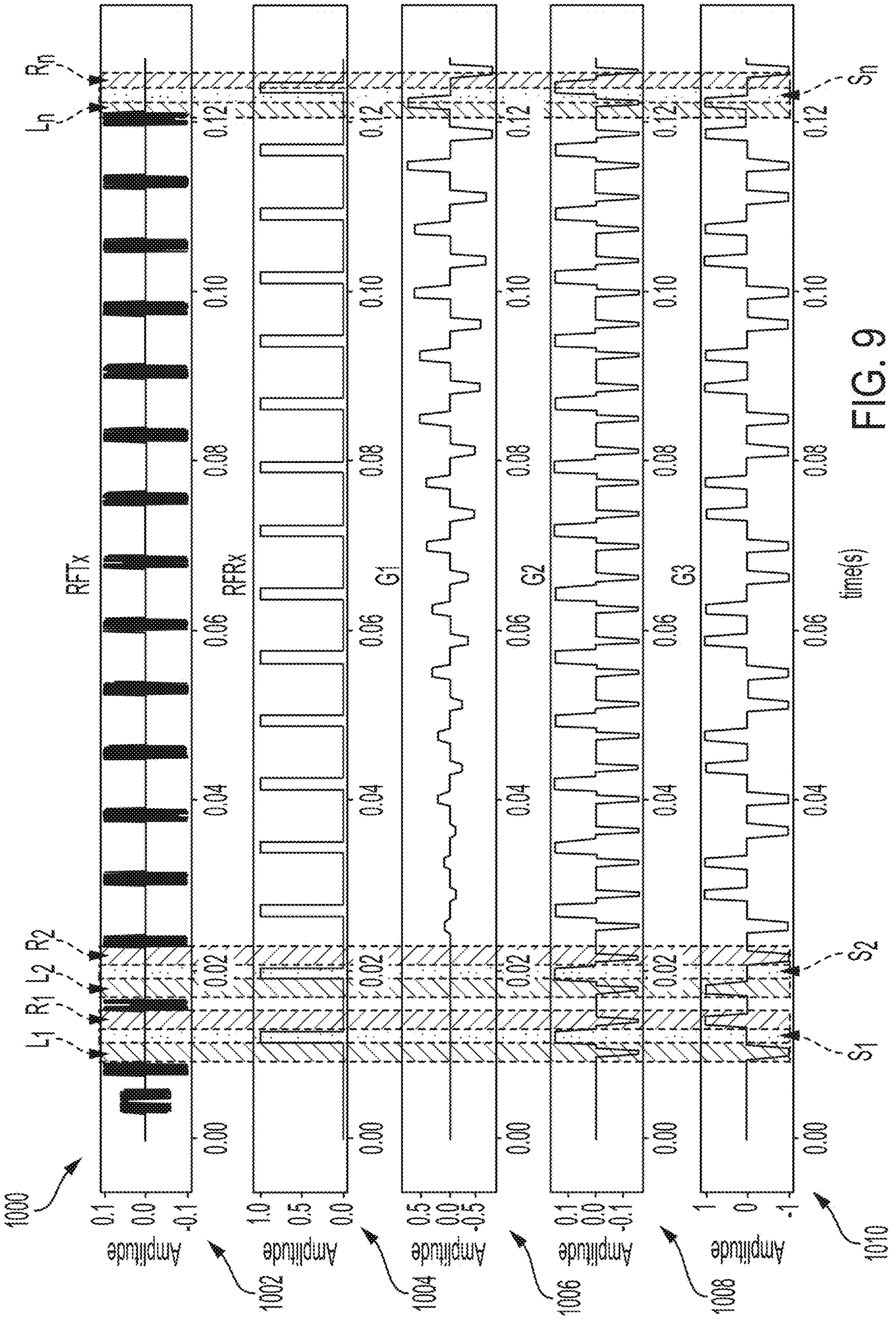
FIG. 9 depicts a pulse sequence diagram depicting pairs of interference periods flanking the signal acquisition periods, in accordance with various aspects of the present disclosure.

Referring now to FIG. 9, an exemplary pulse sequence diagram 1000 for an MRI system, such as the MRI scanning system 100 (FIG. 1), is shown. The pulse sequence diagram 1000 is a multi-echo pulse sequence; however, the reader will appreciate that alternative pulse sequence diagrams are contemplated, such as any type of pulse sequence that includes dead periods between RF pulses and acquisition periods. For example, a multiple gradient echo sequence, or a combined gradient- and spin echo sequence may be implemented. The pulse sequence diagram 1000 includes a RF transmission waveform 1002, a RF reception waveform 1004 (e.g., RF reception windows 1004), a first gradient waveform 1006, a second gradient waveform 1008, and a third gradient waveform 1010. The first gradient waveform 1006 and the third gradient waveform 1010 correspond to waveforms for phase encoding, in various aspects of the present disclosure. The second gradient waveform 1008 corresponds to a waveform for a readout gradient, or frequency encoding gradient, in various aspects of the present disclosure.

Figure 10:
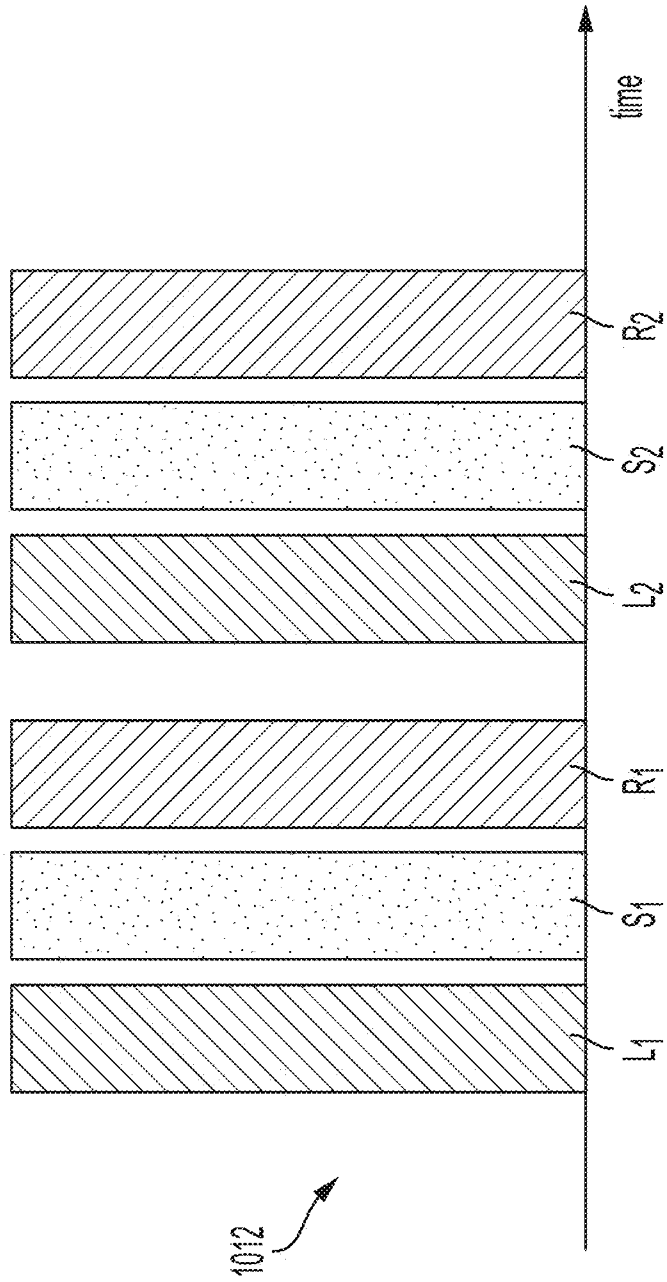
FIG. 10 depicts a detail view of a portion of the timeline of the pulse sequence diagram of FIG. 9, in accordance with various aspects of the present disclosure.

As shown, the readout gradient waveform 1008 is "on" during each MR signal acquisition period $S_1, S_2, \ldots S_n$, where n is an integer representing the number of echo pulses applied in the pulse sequence and, thus, the number of signal acquisition periods in the pulse sequence. The pulse sequence diagram 1000 further depicts a pair of interference periods $L_1$ and $R_1$, $L_2$ and $R_2$, . . . $L_n$ and $R_n$ flanking each signal acquisition period $S_1, S_2, \ldots S_n$. Referring primarily to FIG. 10, the signal acquisition periods $S_1$ and $S_2$ are shown in relation of the interference periods $L_1$, $R_1$, $L_2$, and $R_2$ along a timeline 1012 representing a portion of the pulse sequence diagram 1000.

Referring again to FIG. 9, the interference periods $L_1$ and $R_1$, $L_2$ and $R_2$, . . . $L_n$ and $R_n$ are coincident with gradient switching periods, which are times in which a MR signal is not usually collected. In various instances, the interference period(s) in a pulse sequence can occur whenever (1) a RF pulse is not being applied and (2) a MR signal for imaging data is not being collected. For example, the RF reception coil assembly typically does not collect data while phase encoding gradients are being applied.

In various aspects of the present disclosure, the interference period(s) may not be coincident with gradient switching periods. For example, the interference period(s) may define a "dead period" during which no RF pulse or gradient(s) are being applied. Thus, in various instances, RF signals may be collected during the interference period(s) when no RF pulse or gradient(s) are being applied.

Each pair of interference periods $L_1$ and $R_1$, $L_2$ and $R_2$, . . . $L_n$ and $R_n$ is positioned adjacent to, or flanking, a signal acquisition period $S_1, S_2, \ldots S_n$. Stated differently, the pair of interference periods $L_1$ and $R_1$, $L_2$ and $R_2$, . . . $L_n$ and $R_n$ can be symmetric about the corresponding signal acquisition period $S_1, S_2, \ldots S_n$. Each "pair" of interference periods includes a left-side interference period (e.g. $L_1$, $L_2$) and a right-side interference period (e.g. $R_1$, $R_2$); however, the reader will appreciate that a single interference period can be associated with each MR signal acquisition period in alternative aspects of the present disclosure. In other words, the interference periods may not always come in pairs that flank the signal acquisition period. In still other aspects of the present disclosure, a signal acquisition period can be associated with more than two interference periods.

In other aspects of the present disclosure, the RF transmission coil can be operated continuously during an imaging procedure. In such instances, the signal acquisition periods $S_1$, $S_2$, etc. and the interference periods $L_1$, $R_1$, $L_2$, $R_2$, etc. can be determined and defined post-processing by a control circuit or computer associated with the MRI system (e.g. computer 542 in FIG. 6).

In various instances, the relative durations of the signal acquisition period $S_1, S_2, \ldots S_n$ and the corresponding interference period(s) $L_1$ and $R_1$, $L_2$ and $R_2$, . . . $L_n$ and $R_n$ can vary. The relative durations can be determined based on optimal noise reduction performance. In at least one aspect of the present disclosure, each interference period can match the duration of the signal acquisition period. In other instances, the sum of the interference periods flanking each signal acquisition period can match the during of the signal acquisition period. In still other instances, each interference period or the sum of the interference periods flanking each signal acquisition period can be shorter than or longer than the corresponding signal acquisition period. The relative durations of the signal acquisition periods and interference periods can be constant throughout the duration of the pulse sequence, in various aspects of the present disclosure.

Figure 11:
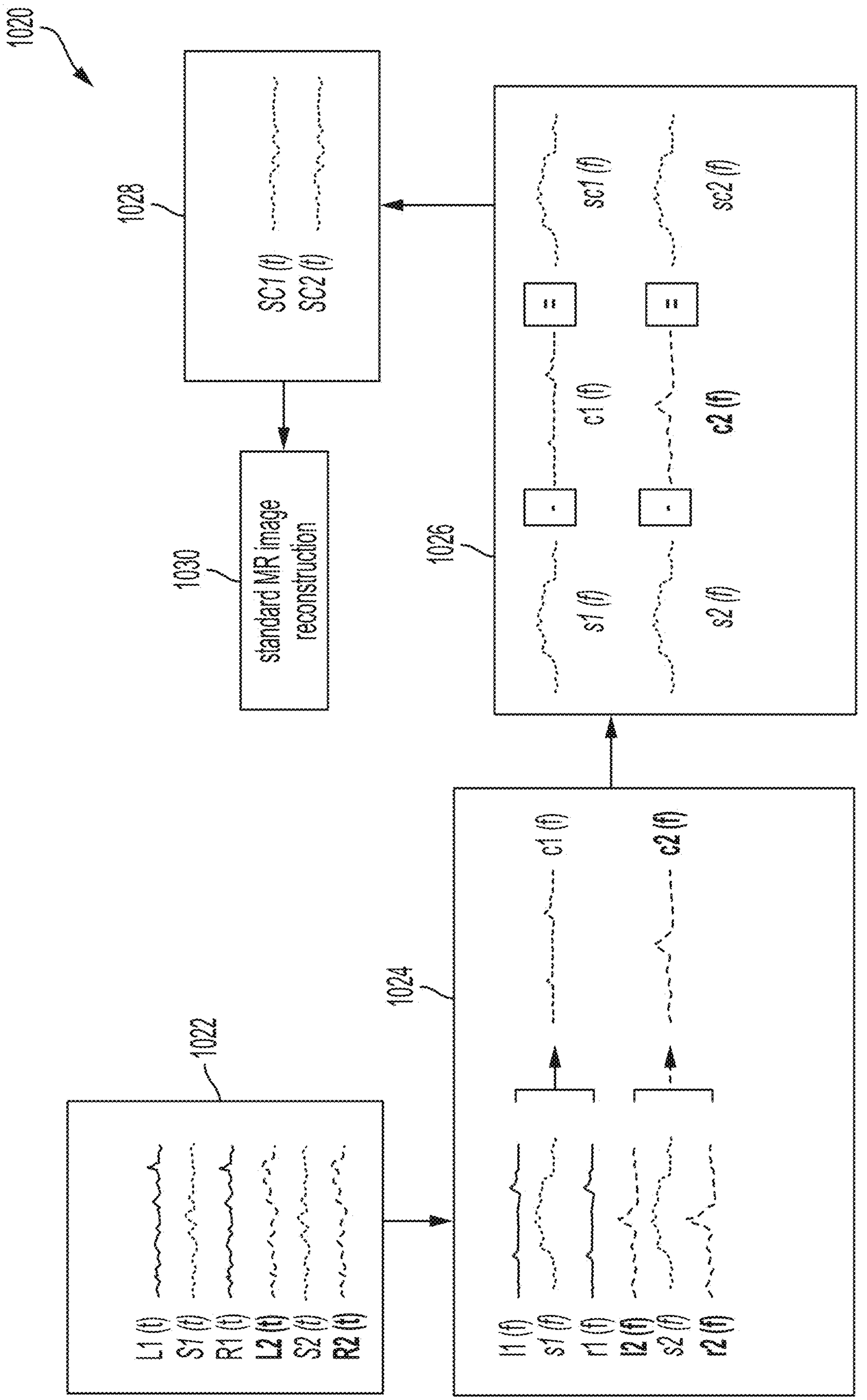
FIG. 11 depicts a flowchart for processing the MR signals acquired during the pulse sequence diagram of FIG. 9, in accordance with various aspects of the present disclosure.

Upon collection of the RF signals during the signal acquisition periods $S_1, S_2, \ldots S_n$ and the interference periods $L_1$ and $R_1$, $L_2$ and $R_2$, . . . $L_n$ and $R_n$, the MRI system and/or a data processing unit coupled thereto is configured to analyze the data to reject the EMI from the MR signal. Referring primarily to FIG. 11, a flowchart for processing the signal data collected during a portion of the pulse sequence of FIG. 9 is shown. In various instances, the system can collect the RF signal as raw data at block 1022 for each interference period and signal acquisition period in the pulse sequence. In various instances, because the interference periods and signal acquisition periods are very short (e.g. 1-3 ms each), any RF interference that arises during both the interference periods (e.g. $L_1$ and $R_1$) can also be assumed to be present during the signal acquisition period (e.g. $S_1$) therebetween, for example.

The raw data (e.g. for the interference periods $L_1$, $R_1$ and the signal acquisition period $S_1$) can then be Fourier transformed to create their corresponding frequency domain spectra depicted for the interference periods $L_n(f)$, $R_n(f)$ and the signal acquisition period $S_n(f)$ at block 1024. For example, common peaks in the raw data associated with each signal acquisition period (e.g. the interference period(s) $L_1$, $R_1$ flanking the signal acquisition period $S_1$) can be identified to create interference correction spectra $C_n$ (f) for each signal acquisition period $S_n$. Determination of the common peaks can be determined by correlation, principal component analysis (PCA), or other known analytical techniques used in signal processing.

In various instances, the correction spectrum $C_n(f)$ can be based on either $L_n$ alone, $R_n$ alone, or an average of $L_n$ and $R_n$, for example. For example, peaks that arise with similar frequency and magnitude in both $L_1$ and $R_1$ can be more likely to originate from EMI than from the MR signal. Additionally, signals that are detected only during the left-side interference period $L_n$ and not the right-side interference period $R_n$, or only right-side interference period $R_n$ and not during the left-side interference period $L_n$, may also be subtracted from the MR signal spectrum $S_n(f)$ the corresponding signal acquisition period $S_n$, in various instances. In other instances, signals that are detected only during the left-side interference period $L_n$ and not the right-side interference period $R_n$, or only right-side interference period $R_n$ and not during the left-side interference period $L_n$, may be retained in the MR signal spectrum $S_n(f)$ the corresponding signal acquisition period $S_n$ in instances in which they represent the true MR signal bleeding into one of the interference periods $L_n$, $R_n$. For example, a single interference period can be used for each signal acquisition period and spurious signals can be determined with, for example, a thresholding technique.

In various instances, the foregoing EMI mitigation procedure can be applied separately to each line of time domain data collected in the full pulse sequence with each separate line of k-space being cleaned using the adjacent control period pair, for example.

In certain aspects of the present disclosure, reference data from more than one pair of interference periods could be used to determine the EM interference in any one MR signal acquisition period. For example, a model can be built to determine the interference correction spectra $C_n(f)$ using reference data spanning the entire image acquisition time period. In one aspect of the present disclosure, some or all of the reference data spanning the entire image acquisition time period can be averaged together to form a superset of reference data in which persistent sources of EM interference dominate. This superset of reference date may be used to determine the interference correction spectra $C_n(f)$.

Referring now to block 1026 in FIG. 11, the correction spectrum $C_n(f)$ can be subtracted from the corresponding signal acquisition spectrum $S_n(f)$ to produce a cleaned signal spectrum $SC_n(f)$. Having subtracted the undesirable frequency components from the MR signal acquisition period spectrum $S_n(f)$, the cleaned signal spectrum $SC_n(f)$ from period $S_n$ is Fourier transformed back to the time domain at block 1028. Upon reverse Fourier transforming the MR signal from the signal acquisition period, the corresponding line of cleaned k-space can be provided to a standard MR image reconstruction algorithm at block 1030 and/or stored for formation of a 2D- or 3D MR image according to known MR image creation techniques, for example.

EXAMPLES

Various additional aspects of the subject matter described herein are set out in the following numbered examples:

Example 1: A method, comprising: projecting a low-field strength magnetic field toward an object of interest located within a field of view; transmitting a radio frequency pulse sequence to a radio frequency coil assembly configured to selectively excite magnetization in the object of interest within the field of view, wherein the radio frequency pulse sequence defines a time of repetition and comprises a signal acquisition period within each time of repetition; receiving an output signal from the radio frequency coil assembly during the signal acquisition period; receiving a sample signal from the radio frequency coil assembly at an interference period within the time of repetition, wherein the interference period flanks the signal acquisition period; comparing the output signal and the sample signal to identify an interference component; adjusting the output signal based on the interference component; and recording the adjusted output signal in a k-space matrix.

Example 2: The method of Example 1, wherein comparing the output signal and the sample signal to identify the interference component comprises performing a Fourier transform computation on the output signal and the sample signal.

Example 3: The method of any one of Example 1 and 2, wherein the interference component comprises undesirable frequency components in the Fourier transformed sample signal.

Example 4: The method of Example 3, wherein adjusting the output signal based on the interference component comprises: subtracting the undesirable frequency components from the Fourier transformed output signal to determine the desirable frequency components; and performing a Fourier transform inversion computation on the desirable frequency components.

Example 5: The method of any one of Examples 1-4, wherein the interference period comprises a pair of interference periods flanking the signal acquisition period, wherein the pair of interference periods comprises a first interference period and a second interference period, and wherein the first interference period and the second interference period are symmetric with respect to the signal acquisition period therebetween.

Example 6: The method of Example 5, wherein the sample signal comprises a first sample signal received in the first interference period and a second sample signal received in the second interference period.

Example 7: The method of Example 6, wherein comparing the output signal to the sample signal to identify the interference component comprises comparing the first sample signal to the second sample signal to identify interference arising during both the first sample signal and the second sample signal.

Example 8: The method of any one of Examples 1 and 5-7, wherein the radio frequency coil assembly comprises a coil array comprising a plurality of radio frequency coil components, wherein the radio frequency pulse sequence further comprises, for each radio frequency coil component, a component signal acquisition period and a component interference period, and wherein the method further comprises, for each component signal acquisition period: receiving the output signal from the radio frequency coil component during the component signal acquisition period; receiving the sample signal from the radio frequency coil component at the component interference period; comparing the output signal and the sample signal for each radio frequency coil component to identify the interference component; adjusting the output signal based on the interference component for each radio frequency coil component; and recording the adjusted output signal in the k-space matrix for each radio frequency coil component.

Example 9: The method of any one of Examples 1 and 5-7, wherein the low-field strength magnetic field comprises a homogeneity between 1000 and 20,000 ppm.

Example 10: The method of any one of Examples 1 and 5-7, wherein the low-field strength magnetic field comprises a heterogeneous field.

Example 11: The method of any one of Examples 1 and 5-10, wherein the low-field strength magnetic field comprises a field strength of less than 1 T.

Example 12: The method of any one of Examples 1 and 5-11, wherein the signal acquisition period is less than 3 ms.

Example 13: The method of any one of Examples 1 and 5-12, wherein the radio frequency pulse sequence comprises a multi-echo pulse sequence.

Example 14: The method of any one of Examples 1 and 5-13, wherein the radio frequency pulse sequence comprises applying a phase encoding gradient along a first gradient within the time of repetition, and wherein the phase encoding gradient temporally overlaps the interference period.

Example 15: The method of any one of Examples 1 and 5-14, wherein the radio frequency pulse sequence comprises applying a phase encoding gradient along a first gradient and a second gradient within the time of repetition, wherein the first gradient and the second gradient are orthogonal, and wherein the phase encoding gradients temporally overlap the interference period.

Example 16: The method of any one of Examples 1 and 5-15, wherein the radio frequency pulse sequence comprises at least one gradient episode coincident with the interference period, and wherein the at least one gradient episode is selected from a list of gradients consisting of a frequency encoding gradient, a prewinding gradient (e.g. rewinding gradient), and a postwinding gradient (e.g., slice selection refocusing gradient).

Example 17: The method of any one of Examples 1 and 5-16, wherein a plurality of gradient episodes are coincident with the interference period.

Example 18: The method of any one of any one of Examples 1 and 5-6, wherein the radio frequency pule sequence comprises applying one or more than one gradient episode within the time of repetition, and wherein the one or more than one gradient episode is not applied while receiving the sample signal.

Example 19: The method of any one of Claims 1 and 5-18, further comprising generating a magnetic resonance image from the k-space matrix.

Example 20: The method of any one of Claims 1-2 and 5-19, wherein the radio frequency coil assembly comprises multi-channel transmit-and-receive coil array.

Example 21: A system, comprising: an array of magnets configured to generate a low-field strength magnetic field toward an object of interest located within a field of view; a radio frequency coil assembly configured to selectively excite magnetization in the object of interest in the field of view; a control circuit comprising a processor and a memory, wherein the memory stores instructions executable by the processor to: transmit a radio frequency pulse sequence to the radio frequency coil assembly, wherein the radio frequency pulse sequence defines a time of repetition, wherein the radio frequency pulse sequence comprises a signal acquisition period and at least one interference period within each time of repetition, wherein each interference period flanks the signal acquisition period; receive an output signal from the radio frequency coil assembly during the signal acquisition period; receive a sample signal from the radio frequency coil assembly during the interference period within the time of repetition; compare the output signal and the sample signal to identify an interference component; adjust the output signal based on the interference component; and record the adjusted output signal in a k-space matrix.

While several forms have been illustrated and described, it is not the intention of Applicant to restrict or limit the scope of the appended claims to such detail. Numerous modifications, variations, changes, substitutions, combinations, and equivalents to those forms may be implemented and will occur to those skilled in the art without departing from the scope of the present disclosure. Moreover, the structure of each element associated with the described forms can be alternatively described as a means for providing the function performed by the element. Also, where materials are disclosed for certain components, other materials may be used. It is therefore to be understood that the foregoing description and the appended claims are intended to cover all such modifications, combinations, and variations as falling within the scope of the disclosed forms. The appended claims are intended to cover all such modifications, variations, changes, substitutions, modifications, and equivalents.

The foregoing detailed description has set forth various forms of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, and/or examples can be implemented, individually and/or collectively, by a wide range of hardware, software, firmware, or virtually any combination thereof. Those skilled in the art will recognize that some aspects of the forms disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as one or more program products in a variety of forms, and that an illustrative form of the subject matter described herein applies regardless of the particular type of signal bearing medium used to actually carry out the distribution.

Instructions used to program logic to perform various disclosed aspects can be stored within a memory in the system, such as dynamic random access memory (DRAM), cache, flash memory, or other storage. Furthermore, the instructions can be distributed via a network or by way of other computer readable media. Thus a machine-readable medium may include any mechanism for storing or transmitting information in a form readable by a machine (e.g., a computer), but is not limited to, floppy diskettes, optical disks, compact disc, read-only memory (CD-ROMs), and magneto-optical disks, read-only memory (ROMs), random access memory (RAM), erasable programmable read-only memory (EPROM), electrically erasable programmable read-only memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the non-transitory computer-readable medium includes any type of tangible machine-readable medium suitable for storing or transmitting electronic instructions or information in a form readable by a machine (e.g., a computer).

As used in any aspect herein, the term "control circuit" may refer to, for example, hardwired circuitry, programmable circuitry (e.g., a computer processor including one or more individual instruction processing cores, processing unit, processor, microcontroller, microcontroller unit, controller, digital signal processor (DSP), programmable logic device (PLD), programmable logic array (PLA), or field programmable gate array (FPGA)), state machine circuitry, firmware that stores instructions executed by programmable circuitry, and any combination thereof. The control circuit may, collectively or individually, be embodied as circuitry that forms part of a larger system, for example, an integrated circuit (IC), an application-specific integrated circuit (ASIC), a system on-chip (SoC), desktop computers, laptop computers, tablet computers, servers, smart phones, etc. Accordingly, as used herein "control circuit" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and/or electrical circuitry forming a communications device (e.g., a modem, communications switch, or optical-electrical equipment). Those having skill in the art will recognize that the subject matter described herein may be implemented in an analog or digital fashion or some combination thereof.

As used in any aspect herein, the term "logic" may refer to an app, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

As used in any aspect herein, the terms "component," "system," "module" and the like can refer to a control circuit computer-related entity, either hardware, a combination of hardware and software, software, or software in execution.

As used in any aspect herein, an "algorithm" refers to a self-consistent sequence of steps leading to a desired result, where a "step" refers to a manipulation of physical quantities and/or logic states which may, though need not necessarily, take the form of electrical or magnetic signals capable of being stored, transferred, combined, compared, and otherwise manipulated. It is common usage to refer to these signals as bits, values, elements, symbols, characters, terms, numbers, or the like. These and similar terms may be associated with the appropriate physical quantities and are merely convenient labels applied to these quantities and/or states.

A network may include a packet switched network. The communication devices may be capable of communicating with each other using a selected packet switched network communications protocol. One example communications protocol may include an Ethernet communications protocol which may be capable permitting communication using a Transmission Control Protocol/Internet Protocol (TCP/IP). The Ethernet protocol may comply or be compatible with the Ethernet standard published by the Institute of Electrical and Electronics Engineers (IEEE) titled "IEEE 802.3 Standard", published in December, 2008 and/or later versions of this standard. Alternatively or additionally, the communication devices may be capable of communicating with each other using an X.25 communications protocol. The X.25 communications protocol may comply or be compatible with a standard promulgated by the International Telecommunication Union-Telecommunication Standardization Sector (ITU-T). Alternatively or additionally, the communication devices may be capable of communicating with each other using a frame relay communications protocol. The frame relay communications protocol may comply or be compatible with a standard promulgated by Consultative Committee for International Telegraph and Telephone (CCITT) and/or the American National Standards Institute (ANSI). Alternatively or additionally, the transceivers may be capable of communicating with each other using an Asynchronous Transfer Mode (ATM) communications protocol. The ATM communications protocol may comply or be compatible with an ATM standard published by the ATM Forum titled "ATM-MPLS Network Interworking 2.0" published August 2001, and/or later versions of this standard. Of course, different and/or after-developed connection-oriented network communication protocols are equally contemplated herein.

Unless specifically stated otherwise as apparent from the foregoing disclosure, it is appreciated that, throughout the foregoing disclosure, discussions using terms such as "processing," "computing," "calculating," "determining," "displaying," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

One or more components may be referred to herein as "configured to," "configurable to," "operable/operative to," "adapted/adaptable," "able to," "conformable/conformed to," etc. Those skilled in the art will recognize that "configured to" can generally encompass active-state components and/or inactive-state components and/or standby-state components, unless context requires otherwise.

The terms "proximal" and "distal" are used herein with reference to a clinician manipulating the handle portion of the surgical instrument. The term "proximal" refers to the portion closest to the clinician and the term "distal" refers to the portion located away from the clinician. It will be further appreciated that, for convenience and clarity, spatial terms such as "vertical", "horizontal", "up", and "down" may be used herein with respect to the drawings. However, surgical instruments are used in many orientations and positions, and these terms are not intended to be limiting and/or absolute.

Those skilled in the art will recognize that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to claims containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that typically a disjunctive word and/or phrase presenting two or more alternative terms, whether in the description, claims, or drawings, should be understood to contemplate the possibilities of including one of the terms, either of the terms, or both terms unless context dictates otherwise. For example, the phrase "A or B" will be typically understood to include the possibilities of "A" or "B" or "A and B."

With respect to the appended claims, those skilled in the art will appreciate that recited operations therein may generally be performed in any order. Also, although various operational flow diagrams are presented in a sequence(s), it should be understood that the various operations may be performed in other orders than those which are illustrated, or may be performed concurrently. Examples of such alternate orderings may include overlapping, interleaved, interrupted, reordered, incremental, preparatory, supplemental, simultaneous, reverse, or other variant orderings, unless context dictates otherwise. Furthermore, terms like "responsive to," "related to," or other past-tense adjectives are generally not intended to exclude such variants, unless context dictates otherwise.

It is worthy to note that any reference to "one aspect," "an aspect," "an exemplification," "one exemplification," and the like means that a particular feature, structure, or characteristic described in connection with the aspect is included in at least one aspect. Thus, appearances of the phrases "in one aspect," "in an aspect," "in an exemplification," and "in one exemplification" in various places throughout the specification are not necessarily all referring to the same aspect. Furthermore, the particular features, structures or characteristics may be combined in any suitable manner in one or more aspects.

Any patent application, patent, non-patent publication, or other disclosure material referred to in this specification and/or listed in any Application Data Sheet is incorporated by reference herein, to the extent that the incorporated materials is not inconsistent herewith. As such, and to the extent necessary, the disclosure as explicitly set forth herein supersedes any conflicting material incorporated herein by reference. Any material, or portion thereof, that is said to be incorporated by reference herein, but which conflicts with existing definitions, statements, or other disclosure material set forth herein will only be incorporated to the extent that no conflict arises between that incorporated material and the existing disclosure material.

In summary, numerous benefits have been described which result from employing the concepts described herein. The foregoing description of the one or more forms has been presented for purposes of illustration and description. It is not intended to be exhaustive or limiting to the precise form disclosed. Modifications or variations are possible in light of the above teachings. The one or more forms were chosen and described in order to illustrate principles and practical application to thereby enable one of ordinary skill in the art to utilize the various forms and with various modifications as are suited to the particular use contemplated. It is intended that the claims submitted herewith define the overall scope.

What is claimed is:

1. A system, comprising:

an array of magnets configured to project a low-field strength magnetic field toward an object of interest located within a field of view;

a radio frequency coil assembly configured to selectively excite magnetization in the object of interest in the field of view; and a control circuit comprising a processor and a memory, wherein the memory stores instructions executable by the processor to:

transmit a radio frequency pulse sequence comprising a signal acquisition period and at least one interference period within a time of repetition to the radio frequency coil assembly;

receive an output signal from the radio frequency coil assembly during the signal acquisition period;

receive a sample signal from the radio frequency coil assembly during the at least one interference period within the time of repetition, wherein the at least one interference period comprises a first interference period and a second interference period, and wherein the sample signal comprises a first sample signal received in the first interference period and a second sample signal received in the second interference period; and compare the output signal and the sample signal to identify an interference component, wherein comparing the output signal to the sample signal to identify the interference component comprises comparing the first sample signal to the second sample signal to identify interference arising during both the first sample signal and the second sample signal.

2. The system of claim 1, wherein the memory stores instructions executable by the processor to adjust the output signal based on the interference component.

3. The system of claim 2, wherein the memory stores instructions executable by the processor to record the adjusted output signal in a k-space matrix.

4. The system of claim 3, wherein the memory stores instructions executable by the processor to generate a magnetic resonance image from the k-space matrix.

5. The system of claim 1, wherein the memory stores instructions executable by the processor to record the output signal in a k-space matrix.

6. The system of claim 1, wherein comparing the output signal and the sample signal to identify the interference component comprises performing a Fourier transform computation on the output signal and the sample signal.

7. The system of claim 6, wherein the interference component comprises undesirable frequency components in the Fourier transformed sample signal.

8. The system of claim 7, wherein the memory stores instructions executable by the processor to adjust the output signal based on the interference component, wherein adjusting the output signal based on the interference component comprises:

subtracting the undesirable frequency components from the Fourier transformed output signal to determine desirable frequency components; and performing a Fourier transform inversion computation on the desirable frequency components.

9. The system of claim 1, wherein the low-field strength magnetic field comprises a homogeneity between 1000 and 20,000 ppm.

10. The system of claim 1, wherein the low-field strength magnetic field comprises a heterogeneous field.

11. The system of claim 1, wherein the low-field strength magnetic field comprises a field strength of less than 1 T.

12. The system of claim 1, wherein the low-field strength magnetic field comprises a field strength between 0.03 T and 1.0 T.

13. The system of claim 1, wherein the signal acquisition period is less than 3 ms.

14. The system of claim 1, wherein the radio frequency pulse sequence comprises a multi-echo pulse sequence.

15. The system of claim 1, wherein the radio frequency pulse sequence comprises a phase encoding gradient applied along a first gradient within the time of repetition, and wherein the phase encoding gradient temporally overlaps the interference period.

16. The system of claim 1, wherein the radio frequency pulse sequence comprises a phase encoding gradient applied along a first gradient and a second gradient within the time of repetition, wherein the first gradient and the second gradient are orthogonal, and wherein the phase encoding gradients temporally overlap the interference period.

17. The system of claim 1, wherein the radio frequency pulse sequence comprises at least one gradient episode coincident with the interference period, and wherein the at least one gradient episode is selected from a list of gradients consisting of a frequency encoding gradient, a prewinding gradient, and a postwinding gradient.

18. The system of claim 17, wherein a plurality of gradient episodes are coincident with the interference period.

19. The system of claim 1, wherein the radio frequency pulse sequence comprises one or more than one gradient episode applied within the time of repetition, and wherein the one or more than one gradient episode is not applied while receiving the sample signal.

20. The system of claim 1, wherein the radio frequency coil assembly comprises a multi-channel transmit-and-receive coil array.

* * * * *